(12) United States Patent
Laackmann

(10) Patent No.: US 7,180,071 B2
(45) Date of Patent: Feb. 20, 2007

(54) INTEGRATED CIRCUIT HAVING RADIATION SENSOR ARRANGEMENT

(75) Inventor: Peter Laackmann, Munich (DE)

(73) Assignee: Infineon Technologies AG, Munich (DE)

( * ) Notice: Subject to any disclaimer, the term of this patent is extended or adjusted under 35 U.S.C. 154(b) by 175 days.

(21) Appl. No.: 10/952,240

(22) Filed: Sep. 28, 2004

(65) Prior Publication Data

US 2005/0067587 A1    Mar. 31, 2005

(30) Foreign Application Priority Data

Sep. 29, 2003  (DE) ................ 103 45 240

(51) Int. Cl.
*G03C 1/725* (2006.01)

(52) U.S. Cl. .......... 250/370.01; 250/370.09; 250/492.1

(58) Field of Classification Search ......... 250/370.01, 250/370.06, 370.07, 370.09, 338.1, 492.1; 365/194

See application file for complete search history.

(56) References Cited

U.S. PATENT DOCUMENTS

| | | | | |
|---|---|---|---|---|
| 4,868,489 | A * | 9/1989 | Kowalski | 324/680 |
| 4,910,707 | A | 3/1990 | Schrenk | |
| 5,485,011 | A * | 1/1996 | Lee et al. | 250/338.1 |
| 5,753,920 | A * | 5/1998 | Buehler et al. | 250/370.06 |
| 5,812,191 | A * | 9/1998 | Orava et al. | 348/308 |
| 5,861,652 | A * | 1/1999 | Cole et al. | 257/386 |
| 6,414,318 | B1 * | 7/2002 | Uber et al. | 250/389 |
| 6,798,234 | B2 * | 9/2004 | Laackmann et al. | 326/21 |
| 6,856,350 | B2 * | 2/2005 | Orava et al. | 348/308 |
| 7,036,018 | B2 * | 4/2006 | Horvat et al. | 713/189 |
| 7,038,307 | B2 * | 5/2006 | Ungar et al. | 257/679 |
| 2002/0126792 | A1 * | 9/2002 | Fuhrmann et al. | 377/1 |
| 2002/0130248 | A1 * | 9/2002 | Bretschneider et al. | 250/214 R |
| 2003/0132777 | A1 * | 7/2003 | Laackman et al. | 326/1 |
| 2003/0218475 | A1 * | 11/2003 | Gammel | 326/8 |
| 2005/0141295 | A1 * | 6/2005 | Laackmann | 365/194 |

FOREIGN PATENT DOCUMENTS

| | | |
|---|---|---|
| DE | 196 01 390 C2 | 7/1997 |
| DE | 101 01 281 C1 | 6/2002 |
| DE | 101 01 995 A1 | 7/2002 |
| DE | 101 11 027 C1 | 8/2002 |
| DE | 101 40 045 A1 | 3/2003 |
| EP | 0 417 447 A2 | 3/1991 |
| EP | 0 510 434 A2 | 10/1992 |
| EP | 1128248 | 8/2001 |

OTHER PUBLICATIONS

French Search Report issued May 16, 2006.

\* cited by examiner

*Primary Examiner*—David Porta
*Assistant Examiner*—Faye Boosalis
(74) *Attorney, Agent, or Firm*—Dickstein, Shapiro, LLP.

(57) ABSTRACT

Integrated circuit including a circuit unit having predefined functionality and a radiation sensor arrangement connected indirectly to the circuit unit. The radiation sensor arrangement has at least one radiation-sensitive element that has at least one circuit property which changes irreversibly when a radiation dose has exceeded a threshold value, thereby causing the radiation sensor arrangement to output a radiation detection signal.

10 Claims, 1 Drawing Sheet

INTEGRATED CIRCUIT HAVING RADIATION SENSOR ARRANGEMENT

CROSS-REFERENCE TO RELATED APPLICATION

This application claims priority to German Patent Application Serial No. 10345240.0, filed Sep. 29, 2003, and which is incorporated herein by reference in its entirety.

FIELD OF THE INVENTION

The present invention relates to electronic circuits containing stored information requiring access protection.

BACKGROUND OF THE INVENTION

In electronic circuits, in particular in circuits containing stored information requiring access protection, a problem arises that the circuit must be protected against unauthorized analysis, in particular against covert discovery of the stored data. Such an operation is performed in many cases using an ion beam technique known as the FIB technique (Focused Ion Beam). A measure is described in DE 101 11 027 for protecting electronic circuits from such an analysis or manipulation. In this measure, by way of example, a memory cell to be protected is connected to an antenna by means of which the charge in the memory cell is altered during such an attack. Another disadvantage is that the reprogramming is reversible and can no longer be detected after such a reversal, or memory contents are modified in the interests of the attacker.

Another possibility for carrying out an attack on electronic circuits whose contents are to be protected is to change, for example, the function of the circuit or the contents of memories using radioactive radiation, for example alpha radiation. Such attacks are also effective when the electronic circuit is not operating and could cause deliberate malfunctioning of the electronic circuit.

SUMMARY OF THE INVENTION

It is therefore an object of the invention to provide the possibility of detecting such an attack, at least on first switching on an electronic circuit again after it has been exposed to radioactive radiation exceeding a preset dose, for example.

Such an irradiation can be irrevocably established by providing the integrated circuit with a radiation sensor arrangement, and connecting certain circuit elements that define the functionality of the integrated circuit into a circuit unit, the radiation-sensitive circuit elements having at least one circuit property that changes irreversibly when a preset radiation dose is exceeded.

Providing a monitoring device and connecting the monitoring device to the circuit device enables the functionality of the circuit unit to be changed after establishing that the preset radiation dose has been exceeded. This change may be, for example, a resetting of the circuit unit or a switching-off of its functionality or part of its functionality. It is also possible that a certain signal is output or saved. A diode or a transistor, for example, are to be provided as preferably radiation-sensitive elements.

BRIEF DESCRIPTION OF THE DRAWINGS

The invention is described in detail below with reference to the drawings, in which.

DETAILED DESCRIPTION OF THE PREFERRED MODE OF THE INVENTION

Figure 1:
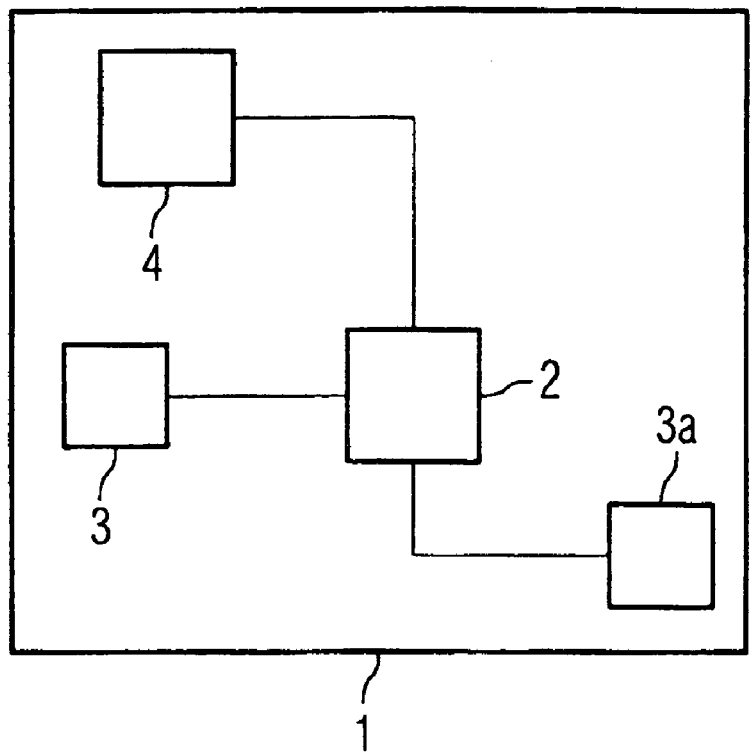
FIG. 1 shows the block diagram of the integrated circuit.

FIG. 1 shows an integrated circuit 1 containing a circuit unit 4. This circuit unit contains a plurality of circuit elements that define the functionality of this circuit unit. These circuit elements may be a microcontroller, RAM memory, ROM memory and other peripheral elements, for example, that enable the operation in order to achieve the desired functionality overall. The actual functionality and its circuit implementation are not specified in further detail because they have no further relevance to the invention. A radiation-sensitive element 3 is arranged near the circuit unit 4 and is in turn connected to a monitoring unit 2. An additional second radiation-sensitive element 3a is shown as an option.

Figure 2:
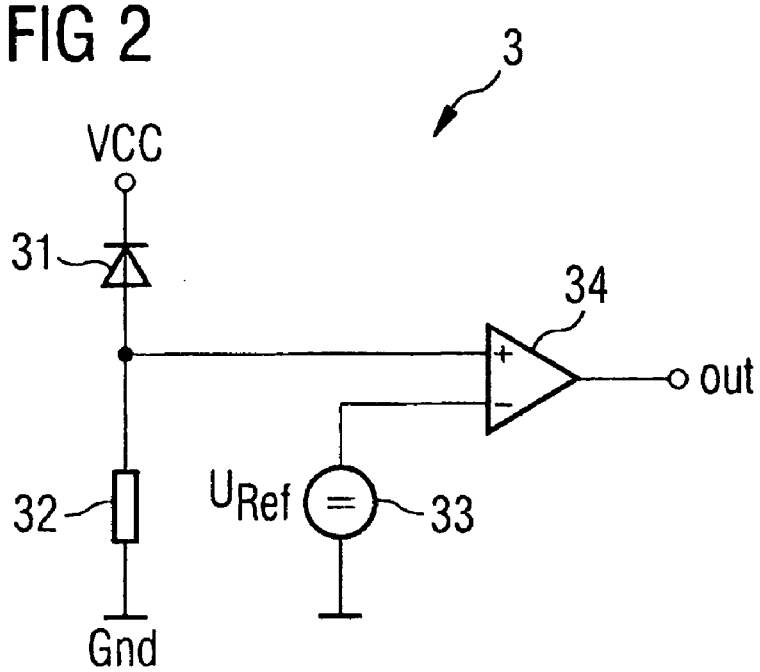
FIG. 2 shows the circuit diagram of a radiation-sensitive element.

FIG. 2 shows the circuit diagram of a simple exemplary embodiment of a radiation-sensitive element. This provides a diode 31 that is connected in reverse bias to an operating voltage potential VCC at one end and via a resistor 32 to a ground potential GND at the other end. An input to the comparator or comparison unit 34 is connected to the junction between the diode 31 and the resistor 32. A second input to the comparator 34 is connected to a reference voltage source 33.

In normal circumstances, the diode is reverse biased, and thus no current flows, or rather only the leakage current given in its specification. This leakage current results in a very small voltage drop across the resistor 32. This voltage drop 32 is consequently compared in the comparator 34 with the reference voltage Uref output by the reference voltage source 33. In normal circumstances the voltage drop across the resistor 32 equals the reference voltage Uref, for example. The comparator 34 outputs at the output OUT a preset signal that depends on whether the voltage drop across the resistor 32 does or does not exceed a preset value compared with the reference voltage.

Above a certain amount of radioactive radiation, such a diode will change its properties in such a way that it no longer exhibits reverse-bias properties or the leakage current rises significantly. This is then immediately detectable as an increased voltage drop across the resistor 32 as soon as the circuit is switched on. The comparator 34 consequently outputs in this case a suitable output signal at the output OUT.

With reference to FIG. 1, this would mean that the comparator 34 is provided at the output of the radiation-sensitive element in FIG. 1, and connected to the monitoring unit 2. This in turn detects that the comparator 34 is outputting an output signal that is to be interpreted in such a way that the circuit has been exposed to an amount of radioactive radiation that has exceeded a preset dose. In the exemplary embodiment of FIG. 1, the monitoring device 2 now outputs a monitoring signal to the circuit unit 4. This may mean that the circuit unit 4 is switched off, that a relevant functionality is disabled or that all memory contents are reset, for example.

Since it may be possible to perform manipulations on an integrated circuit by means of radioactive radiation while in the process protecting the radiation-sensitive element 3 from the radiation by means of a suitable cover, an advantageous development provides that at least one additional radiation-sensitive element 3a is provided. In this case, as in the case of all safety measures, the costs and benefits must be weighed up. The more radiation-sensitive elements provided on the integrated circuit, the harder it will be to cover them all and simultaneously, by means of radiation, perform the required manipulation or perform the manipulation without this being detected at least by one of the radiation-sensitive elements. On the other hand, many such radiation-sensitive elements have the disadvantage that they have a certain space requirement, while the circuit shown in FIG. 2 requires only very little space.

A transistor with suitable circuitry could also be provided in place of the diode shown in FIG. 2. In addition, the change in the electrical properties of a polysilicon resistor could be evaluated.

In any case, it is advantageous that using the radiation-sensitive element described the irradiation is detected even when the integrated circuit is switched off during the irradiation. As soon as the integrated circuit is switched on again, detection of the irradiation is performed immediately and can be used to convert the circuit unit into a safe predefined condition.

The invention claimed is:

1. An integrated circuit comprising:
   a circuit unit having predefined functionality; and
   a radiation sensor arrangement connected indirectly to the circuit unit and having at least one radiation-sensitive element that has at least one circuit property which changes irreversibly when a radiation dose has exceeded a threshold value, thereby causing the radiation sensor arrangement to output a radiation detection signal.

2. The integrated circuit as claimed in claim 1, further comprising a monitoring device connected between the circuit unit and the radiation sensor arrangement, and which monitors the circuit property.

3. The integrated circuit as claimed in claim 2, wherein the monitoring device changes the functionality of the circuit unit upon detection of the radiation detection signal.

4. The integrated circuit as claimed in claim 3, wherein the change in functionality is a switching-off of the circuit unit.

5. The integrated circuit as claimed in claim 3, wherein the change in functionality is a resetting of the circuit unit into a predefined condition.

6. The integrated circuit as claimed in claim 1, wherein the radiation-sensitive circuit element is a diode.

7. The integrated circuit as claimed in claim 1, wherein the radiation-sensitive circuit element is a transistor.

8. The integrated circuit as claimed in claim 1, wherein the radiation-sensitive circuit element is a polysilicon resistor.

9. The Integrated circuit as claimed In claim 1, whereIn the circuit unit comprises at least one element selected from the group consisting of a microcontroller, a RAM, and a ROM.

10. An Integrated circuit comprising:
    a circuit unit having predefined functionality; and
    at least one radiation-sensitive element that has at least one circuit property which changes irreversibly when a radiation dose has exceeded a threshold value,
    wherein the integrated circuit unit keeps its predefined functionality after radiation has caused the irreversible change of the at least one circuit property of the at least one radiation sensitive element.

* * * * *

UNITED STATES PATENT AND TRADEMARK OFFICE
CERTIFICATE OF CORRECTION

| | | |
|---|---|---|
| PATENT NO. | : 7,180,071 B2 | Page 1 of 1 |
| APPLICATION NO. | : 10/952240 | |
| DATED | : February 20, 2007 | |
| INVENTOR(S) | : Peter Laackmann | |

It is certified that error appears in the above-identified patent and that said Letters Patent is hereby corrected as shown below:

In column 4, claim 9, "The Integrated circuit as claimed In claim 1, whereIn" should read --The integrated circuit as claimed in claim 1, wherein--

In column 4, claim 10, "Integrated" should read --integrated--

Signed and Sealed this

Twenty-fourth Day of April, 2007

JON W. DUDAS
*Director of the United States Patent and Trademark Office*